United States Patent
Ko

(10) Patent No.: US 10,014,048 B2
(45) Date of Patent: Jul. 3, 2018

(54) DUAL INTERLOCKED STORAGE CELL (DICE) LATCH SHARING ACTIVE REGION WITH NEIGHBOR DICE LATCH AND SEMICONDUCTOR DEVICE INCLUDING THE SAME

(71) Applicant: SK hynix Inc., Icheon-si Gyeonggi-do (KR)

(72) Inventor: Dong Uc Ko, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/486,051

(22) Filed: Apr. 12, 2017

(65) Prior Publication Data

US 2018/0130518 A1 May 10, 2018

(30) Foreign Application Priority Data

Nov. 8, 2016 (KR) .......... 10-2016-0148066

(51) Int. Cl.
| | |
|---|---|
| *G11C 11/00* | (2006.01) |
| *G11C 11/412* | (2006.01) |
| *H01L 27/11* | (2006.01) |
| *H01L 27/07* | (2006.01) |
| *H01L 27/02* | (2006.01) |
| *G11C 11/417* | (2006.01) |
| *H01L 23/528* | (2006.01) |

(52) U.S. Cl.
CPC .......... *G11C 11/412* (2013.01); *G11C 11/417* (2013.01); *H01L 23/528* (2013.01); *H01L 27/0207* (2013.01); *H01L 27/0705* (2013.01); *H01L 27/1104* (2013.01)

(58) Field of Classification Search
CPC ..... G11C 11/412; G11C 11/417; G11C 11/413; G11C 11/4125; H01L 27/11807
USPC ............. 365/154, 156; 326/14–15, 38; 327/200–201, 208–210, 205
See application file for complete search history.

(56) References Cited

U.S. PATENT DOCUMENTS

| | | | | |
|---|---|---|---|---|
| 5,880,604 A | * | 3/1999 | Kawahara | ........ H03K 3/356113 326/121 |
| 6,232,793 B1 | * | 5/2001 | Arimoto | ............. H01L 27/0218 257/E27.112 |
| 7,719,304 B1 | * | 5/2010 | Clark | .................. H03K 3/0372 326/14 |
| 2009/0184733 A1 | * | 7/2009 | Lilja | .................... G06F 17/5068 326/101 |
| 2010/0264953 A1 | * | 10/2010 | Lilja | .................... G06F 17/5068 326/12 |

(Continued)

FOREIGN PATENT DOCUMENTS

KR 1020160010166 A 1/2016

OTHER PUBLICATIONS

M. Menouni, D. Arutinov, M. Barbero, R. Beccherle, P. Breugnon, et al.. Design and measurements of SEU tolerant latches. TWEEP-08 Topical Workshop on Electronics for Particle Physics, Sep. 2008, Naxos, Greece. pp. 402-405, 2008.

*Primary Examiner* — Gene Auduong
(74) *Attorney, Agent, or Firm* — William Park & Associates Ltd.

(57) ABSTRACT

A dual interlocked storage cell (DICE) latch may be provided. A semiconductor device may be provided. The semiconductor device may include a DICE latch.

14 Claims, 6 Drawing Sheets

(56) References Cited

U.S. PATENT DOCUMENTS

2016/0020754 A1    1/2016  Kim et al.
2016/0260474 A1*  9/2016  Liu .......................... G11C 11/34

* cited by examiner

DUAL INTERLOCKED STORAGE CELL (DICE) LATCH SHARING ACTIVE REGION WITH NEIGHBOR DICE LATCH AND SEMICONDUCTOR DEVICE INCLUDING THE SAME

CROSS-REFERENCE TO RELATED APPLICATION

The priority of Korean patent application No. 10-2016-0148066 filed on 8 Nov. 2016, the disclosure of which is hereby incorporated in its entirety by reference, is claimed.

BACKGROUND

1. Technical Field

Embodiments of the present disclosure may generally relate to a dual interlocked storage cell (DICE) latch and a semiconductor device including a DICE latch.

2. Related Art

Structures for latching input data in a semiconductor device have been widely used in various circuits.

FIG. 1 is a circuit diagram illustrating a latch circuit for use in a conventional semiconductor device.

Referring to FIG. 1, a circuit for latching input data (IN) includes two inverters INV1 and INV2. FIG. 1 also illustrates a supply voltage VDD and a ground voltage VSS.

An input terminal of the first inverter INV1 is coupled to an output terminal of the second inverter INV2 and an output terminal of the first inverter INV1 is coupled to an input terminal of the second inverter INV2, such that a logical level of an input node IN is complementary to a logical level of an output node OUT and the complementary state of the logical levels of the input node IN and the output node OUT remains unchanged.

For example, if the input node IN is at a logic high potential state, the output node OUT is at a logic low potential state so that the output node OUT is stable. In contrast, if the input node IN is at a logic low potential state, the output node OUT is at a logic high potential so that the output node OUT is stable. As described above, a latch circuit composed of two inverters INV1 and INV2 has two different stable logical states according to whether the input node IN and the output node OUT are at a logic high potential state or at a logic low potential state, and remains the two different stable logical states.

However, if radiation is applied to the latch circuit, a memory state of the latch circuit becomes unstable such that there is a high possibility of causing a malfunction referred to as inversion of the memory state.

The above-mentioned phenomenon is referred to as a soft error, ionizing radiation may be caused by alpha (α) rays generated from a package or line material. Specifically, the soft error more easily occurs in proportion to the reducing power-supply voltage, such that improvement of the soft error rate characteristics is of importance to the latest low-power-driven semiconductor devices.

SUMMARY

In accordance with an aspect of the present disclosure, a dual interlocked storage cell (DICE) latch may be provided. In accordance with an aspect of the present disclosure, a semiconductor device may be provided. The semiconductor device may include a DICE latch.

DETAILED DESCRIPTION

Reference will now be made to certain embodiments, examples of which are illustrated in the accompanying drawings. Wherever possible, the same reference numbers will be used throughout the drawings to refer to the same or like parts. In the following description, a description of related known configurations or functions incorporated herein will be omitted when it may make the subject matter less clear.

Embodiments of the present disclosure may relate to a semiconductor device for improving soft error rate characteristics without increasing an overall region of DICE latches.

Various embodiments of the present disclosure may be directed to providing a semiconductor device including dice latches that substantially obviates one or more problems due to limitations and disadvantages of the related art.

An embodiment of the present disclosure may relate to a semiconductor device configured for improving soft error rate characteristics without increasing a total region of DICE latches by improving a layout structure of DICE latches.

Figure 1:
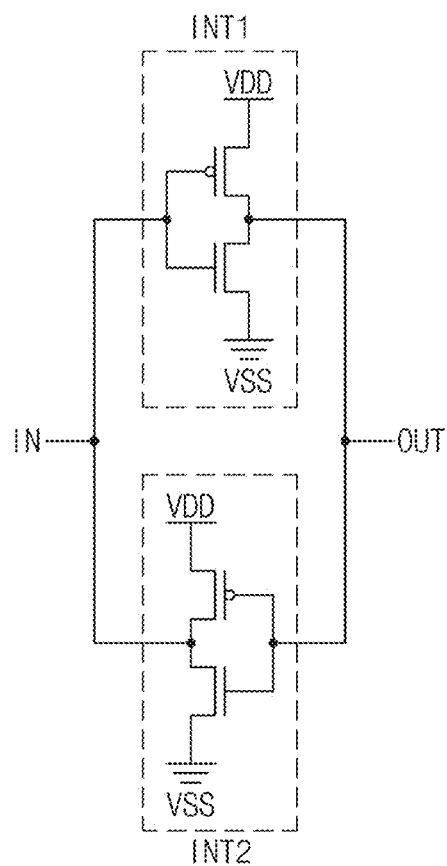
FIG. 1 is a circuit diagram illustrating a latch circuit for use in a conventional semiconductor device.
Figure 2:
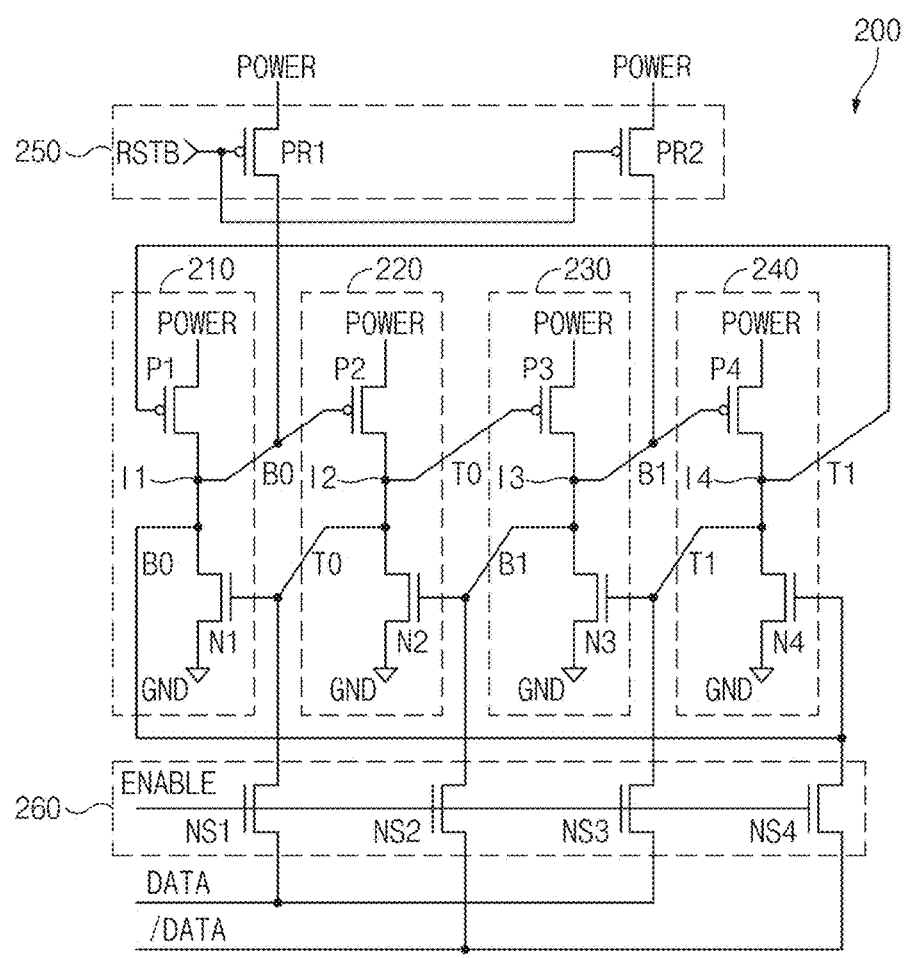
FIG. 2 is a circuit diagram illustrating a representation of an example of a DICE latch.
Figure 3:
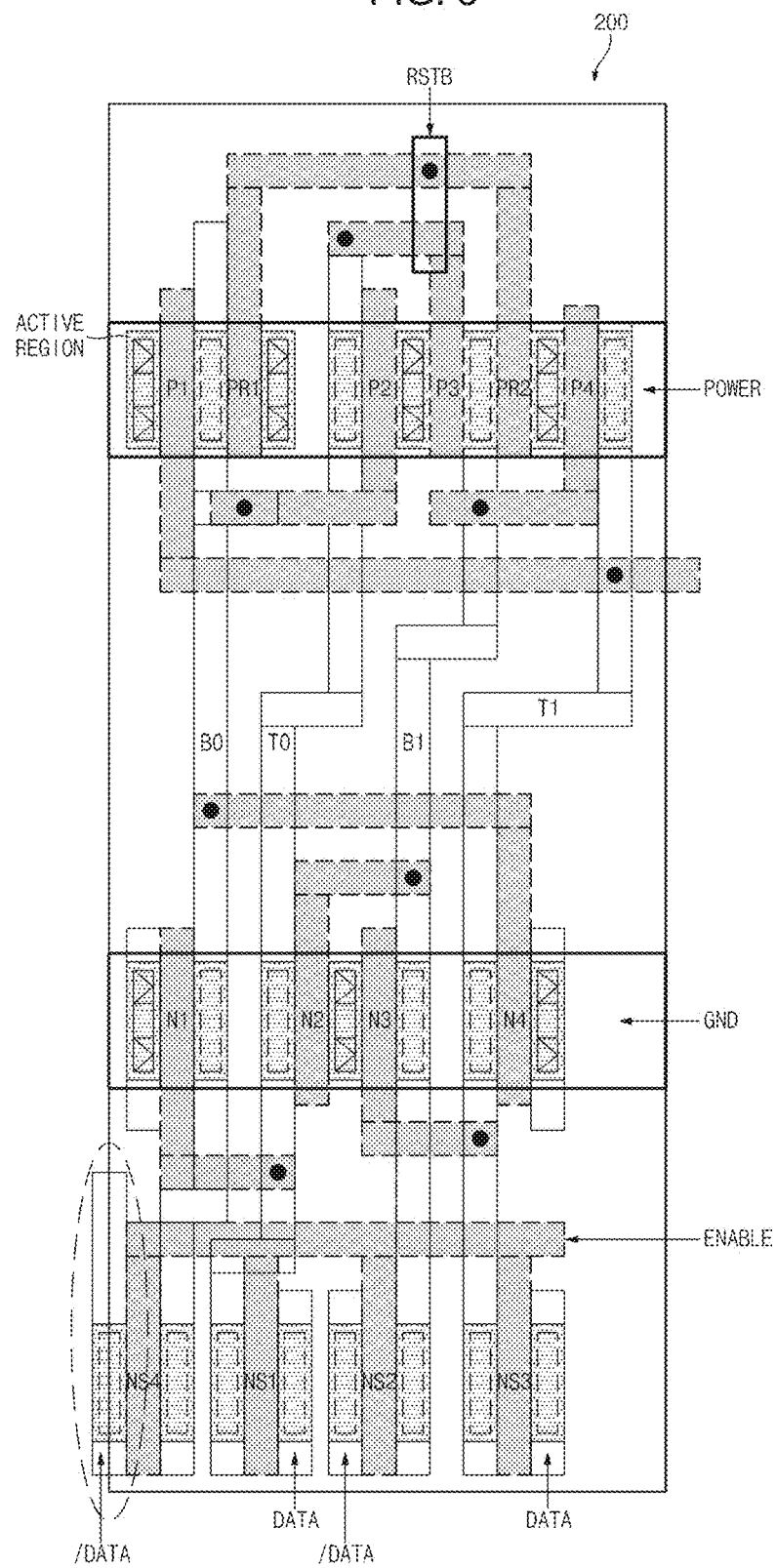
FIG. 3 is a layout diagram illustrating a representation of an example of an arrangement of the DICE latch illustrated in FIG. 2 according to an embodiment of the present disclosure.

FIG. 2 is a circuit diagram illustrating a DICE latch. FIG. 3 is a layout diagram illustrating arrangement of the DICE latch illustrated in FIG. 2 according to an embodiment of the present disclosure. For convenience of description, as illustrated in FIG. 3, reference numbers of transistors illustrated in FIG. 2 are marked on gate terminals of the transistors constructing the DICE latch.

The DICE latch 200 may include latch circuits 210, 220, 230 and 240, a reset circuit 250, and a data input circuit 260. Here, the latch circuits 210, 220, 230 and 240 may include at least four even transistor groups (P1, N1), (P2, N2), (P3, N3) and (P4, N4) and at least four even connection lines B0, T0, B1 and T1. In this case, the connection lines B0, T0, B1 and T1 may be formed of metal lines.

The latch circuits 210, 220, 230 and 240 may store signals through the connection lines B0, T0, B1 and T1 which are alternately inversion-driven.

A transistor group (P1, N1) may include a PMOS transistor P1 and an NMOS transistor N1 coupled in series to each other at both sides of a connection node I1. A transistor group (P2, N2) may include a PMOS transistor P2 and an NMOS transistor N2 coupled in series to each other at both sides of a connection node I2. A transistor group (P3, N3) may include a PMOS transistor P3 and an NMOS transistor N3 coupled in series to each other at both sides of a connection node I3. A transistor group (P4, N4) may include a PMOS transistor P4 and an NMOS transistor N4 coupled in series to each other at both sides of a connection node I4.

The connection lines B0, T0, B1 and T1 may interconnect the transistor groups (P1, N1), (P2, N2), (P3, N3) and (P4, N4) in the form of a loop shape ( . . . P4, N4→P1, N1→P2, N2→P3, N3→P4, N4→P1, N1 . . . ). In this case, the connection lines B0, T0, B1 and T1 may couple the connection nodes I1, I2, I3 and I4 respectively contained in the respective transistor groups (P1, N1), (P2, N2), (P3, N3) and (P4, N4) to gate terminals of NMOS transistors N4, N1, N2 and N3 respectively contained in the former transistor groups (P4, N4), (P1, N1), (P2, N2) and (P3, N3), respectively. In addition, the connection lines B0, T0, B1 and T1 may couple the connection nodes I1, I2, I3 and I4 respectively contained in the respective transistor groups (P1, N1), (P2, N2), (P3, N3) and (P4, N4) to PMOS transistors P2, P3, P4 and P1 respectively contained in the latter transistor groups (P2, N2), (P3, N3), (P4, N4) and (P1, N1), respectively.

Through the above-mentioned structure, the connection lines B0, T0, B1 and T1 are classified into two connection line groups (B0, B1) and (T0, T1) which are alternately inversion-driven to have the same logical level. For example, assuming that two odd connection lines B0 and B1 from among the four connection lines B0, T0, B1 and T1 are set to a first connection line group (B0, B1) and become at a logic high level, two even connection lines T0 and T1 are set to a second connection line group (T0, T1) and become at a logic low level. In contrast, assuming that the first connection line group (B0, B1) is at a logic low level, the second connection line group (T0, T1) becomes at a logic high level.

The reset circuit 250 may reset the DICE latch in response to a reset control signal RSTB. For this purpose, the reset circuit 250 may couple connection lines contained in any one of two connection line groups (B0, B1) and (T0, T1) to a power-supply voltage terminal POWER or a ground voltage terminal GND upon receiving the reset control signal RSTB. That is, upon receiving the reset control signal RSTB, the reset circuit 250 may couple connection lines contained in the first connection line group (B0, B1) to the power-supply voltage terminal POWER or the ground voltage terminal GND, or may couple connection lines contained in the second connection line group (T0, T1) to the power-supply voltage terminal POWER or a ground voltage terminal GND.

For example, the reset circuit 250 of FIG. 2 may couple two connection lines contained in the first connection line group (B0, B1) to the power-supply voltage terminal POWER in response to the reset control signal RSTB. The reset circuit 250 may include a first PMOS transistor PR1 and a second PMOS transistor PR2. The PMOS transistor PR1 may be disposed between the power-supply voltage terminal POWER and the connection line B0, and may receive the reset control signal RSTB through a gate terminal thereof. The PMOS transistor PR2 may be disposed between the power-supply voltage terminal POWER and the connection line B1, and may receive the reset control signal RSTB through a gate terminal thereof.

As illustrated in FIG. 3, the PMOS transistor PR1 of the reset circuit 250 may be located adjacent to the PMOS transistor P1 of the transistor group (P1, N1) in such a manner that the PMOS transistor PR1 of the reset circuit 250 and the PMOS transistor P1 of the transistor group (P1, N1) may share the same active region. For example, since gates are formed in the same active region of the PMOS transistors PR1 and P1, a common junction (drain) may be formed between the gates of the PMOS transistors PR1 and P1, and the common drain may be coupled to the connection line B0.

The PMOS transistor PR2 of the reset circuit 250 may be arranged to share the same active region with the PMOS transistors P2, P3 and P4 of the transistor groups (P2, N2), (P3, N3) and (P4, N4). For example, gates of the PMOS transistors P2 and P3, a gate of the PMOS transistor PR2, and a gate of the PMOS transistor P4 may be sequentially arranged at intervals of a predetermined distance within a single active region, and junctions (source/drain) of the corresponding active region may be coupled to the power-supply voltage terminal (POWER) and the connection lines T0, B1 and T1 as illustrated in FIG. 3.

Referring back to FIG. 2, the data input circuit 260 may input data DATA and /DATA to the latch circuits 210, 220, 230 and 240 in response to an input control signal ENABLE. For this purpose, upon receiving the input control signal ENABLE, the data input circuit 260 may couple any one of two connection line groups (B0, B1) and (T0, T1) to an input terminal of data (DATA), and may couple the remaining one connection line group to an input terminal of the other data (/DATA).

For example, upon receiving the input control signal ENABLE, the data input circuit 260 of FIG. 20 may couple two connection lines contained in the first connection line group (B0, B1) to the data (/DATA) input terminal, and may couple two connection lines contained in the second connection line group (T0, T1) to the data (DATA) input terminal. The data input circuit 260 may include a first NMOS transistor NS1, a second NMOS transistor NS2, a third NMOS transistor NS3, and a fourth NMOS transistor NS4. In an embodiment, the data input circuit 260 may include first to fourth switching elements. The first NMOS transistor NS1 may be disposed between the connection line T0 and the data (DATA) input terminal, and may receive the input control signal ENABLE through a gate terminal thereof. The second NMOS transistor NS2 may be disposed between the connection line B1 and the data (/DATA) input terminal, and may receive the input control signal ENABLE through a gate terminal thereof. The third NMOS transistor NS3 may be disposed between the connection line T1 and the data (DATA) input terminal, and may receive the input control signal ENABLE through a gate terminal thereof. The fourth NMOS transistor NS4 may be disposed between the connection line B0 and the data (/DATA) input terminal, and may receive the input control signal ENABLE through a gate terminal thereof.

In this case, as illustrated in FIG. 3, four NMOS transistors NS1, NS2, NS3 and NS4 contained in the data input circuit 260 may be located close to four NMOS transistors N1, N2, N3 and N4 respectively contained in the transistor groups (P1, N1), (P2, N2), (P3, N3) and (P4, N4).

However, NMOS transistors NS1, NS2, NS3 and NS4 of the data input circuit 260 according to the embodiment of the present disclosure do not share the active region, are independently formed in different active regions, and are spaced apart from each other by a predetermined distance. Furthermore, the NMOS transistors NS1, NS2, NS3 and NS4 of the data input circuit 260 may be arranged in a manner that transistors (NS1, NS3) and (NS2, NS4) configured to receive data having the same logic level are not adjacent to each other such that the transistors (NS1, NS3) do not neighbor with the transistors (NS2, NS4). In other words, transistors configured to receive different logic levels of data are alternately arranged.

Through the above-mentioned arrangement structure, the DICE latch according to an embodiment may reduce a possibility of causing the soft error generated by interference between transistors configured to receive data of the same logic level. For example, assuming that the same logic level transistors from among the NMOS transistors NS1, NS2, NS3 and NS4 of the data input circuit 260 contained in the same DICE latch are configured to share the active region, it is difficult to overcome the soft error caused by external factors. However, since NMOS transistors NS1, NS2, NS3 and NS4 of the data input circuit 260 are independently formed in different active regions, although the soft error occurs in any one data, an embodiment of the present disclosure can easily overcome the soft error due to characteristics of the DICE latch structure.

However, if the active regions of the NMOS transistors NS1, NS2, NS3 and NS4 of the data input circuit 260 of the same DICE latch are separated from each other, the region the DICE latch may greatly increase in size, as compared to the case in which transistors (e.g., NS1 and NS3) configured to receive the same logic level data share the active region.

Therefore, in order to compensate for the increasing region of the DICE latch, the active region of the outermost transistor NS4 or NS3 from among the NMOS transistors NS1, NS2, NS3 and NS4 of the data input circuit 260 may be shared by the contiguous DICE latch. For example, as illustrated in a circular shape denoted by dotted lines in FIG. 3, the active region of the first NMOS transistor NS4 from among the NMOS transistors NS1, NS2, NS3 and NS4 of the data input circuit 260 may be formed to deviate from the corresponding DICE latch region.

Figure 4:
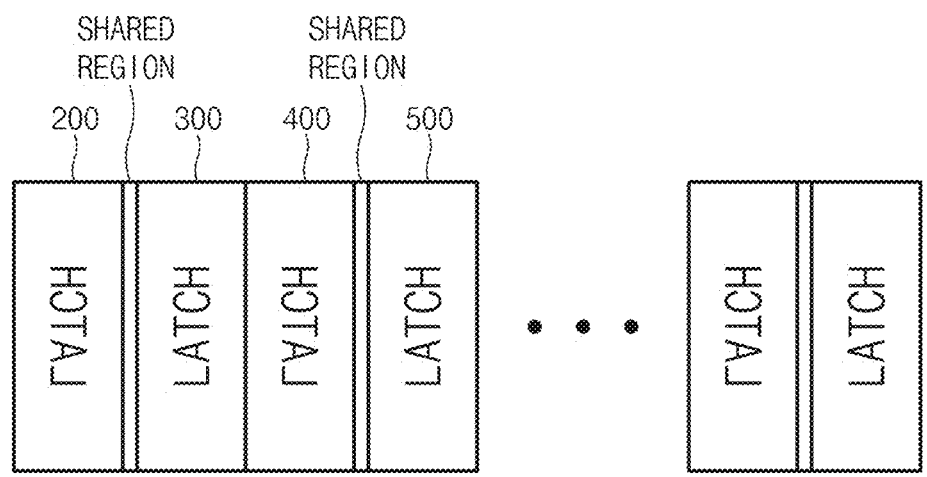
FIG. 4 is a conceptual diagram illustrating that specific regions of contiguous DICE latches are shared when the DICE latches are successively arranged.

FIG. 4 is a conceptual diagram illustrating that specific regions of contiguous DICE latches are shared when the DICE latches are successively arranged.

As can be seen from the DICE latch arrangement of FIG. 4, two contiguous DICE latches (200, 300) or (400, 500) from among successively-arranged DICE latches (200, 300, 400, 500, . . . ) make one pair and some parts thereof are shared.

In this case, the DICE latches (200, 300), (400, 500), . . . , or the like, configured to make one pair may be symmetrical to each other on the basis of a shared region interposed therebetween.

Figure 5:
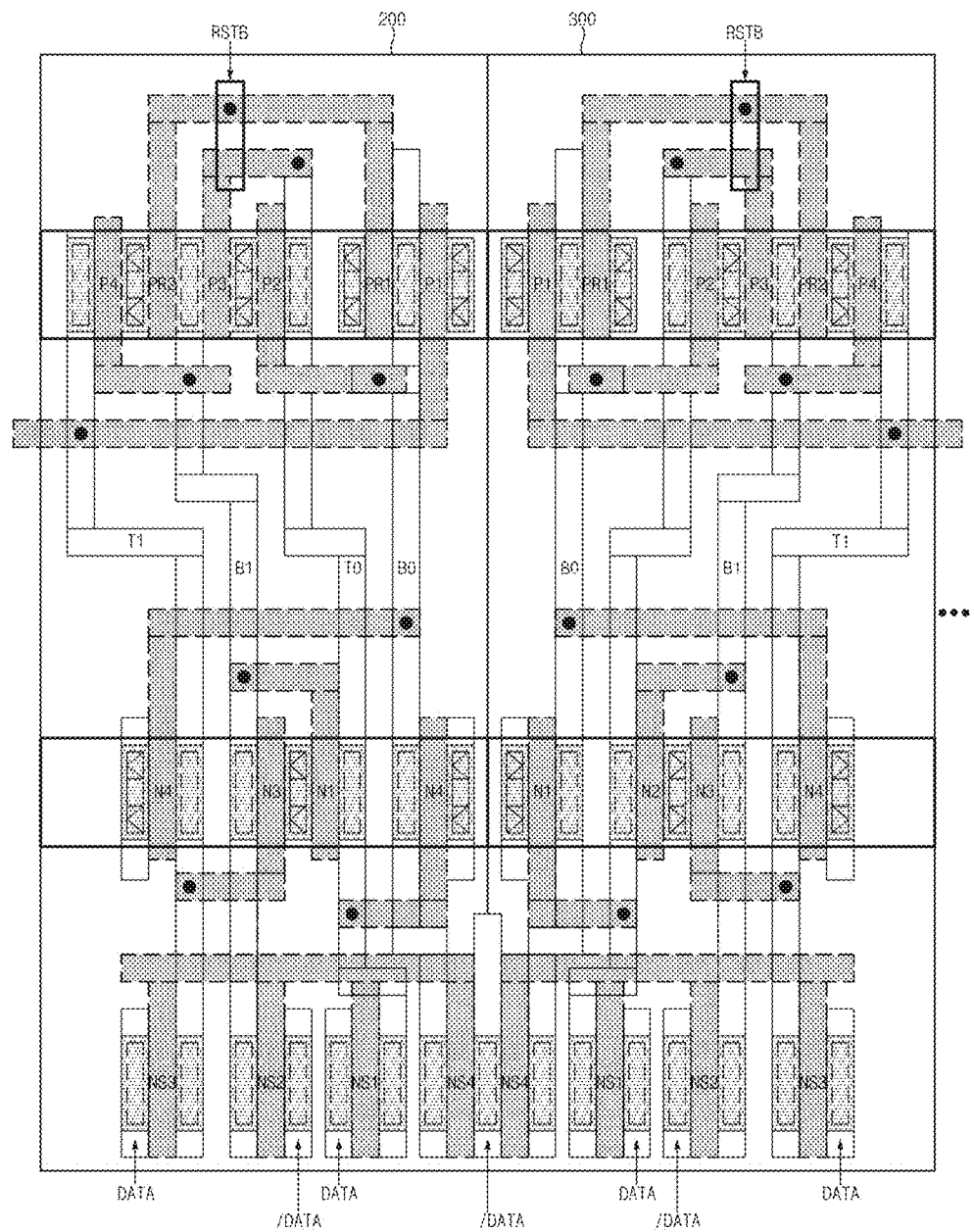
FIG. 5 is a conceptual diagram illustrating that DICE latches each having the structure of FIG. 3 are successively arranged as illustrated in FIG. 4.

FIG. 5 is a conceptual diagram illustrating that DICE latches each having the structure of FIG. 3 are successively arranged as illustrated in FIG. 4.

Referring to FIG. 5, some portions of the active regions in which the outermost NMOS transistors NS4 of the data input circuits of the contiguous DICE latches 200 and 300 are formed are shared. That is, junction parts, to which data /DATA is input, from among the active regions of the NMOS transistors NS4 of the data input circuits of the DICE latches 200 and 300 may be shared. Transistors and connection lines of the DICE latch 200 may be arranged to be symmetrical to transistors and connection lines of the other DICE latch 300.

As described above, according to the embodiments, the active regions of transistors (e.g., NS1 and NS3) configured to receive the same logic level data in the data input circuit 260 contained in the same DICE latch are not shared, and specific regions of different neighbor DICE latches 200 and 300 are shared, such that the size of an overall region needed to form the DICE latches is not increased.

In addition, although a soft error occurs in data of the NMOS transistors sharing the active region, the soft error affects only one connection line B0 from the viewpoint of each DICE latch, such that the corresponding data can be recovered by the other connection line B1 contained in the same connection line group.

Although the above-mentioned embodiments have disclosed that the active regions of the first NMOS transistors NS4 (i.e., NMOS transistors coupled to the connection line B0) from among the NMOS transistors of the data input circuit 260 are shared, it should be noted that the active regions of the last NMOS transistors NS3 (i.e., NMOS transistors coupled to the connection line T1) can also be shared.

As is apparent from the above description, the semiconductor devices can improve soft error rate characteristics without increasing a total region of DICE latches.

Figure 6:
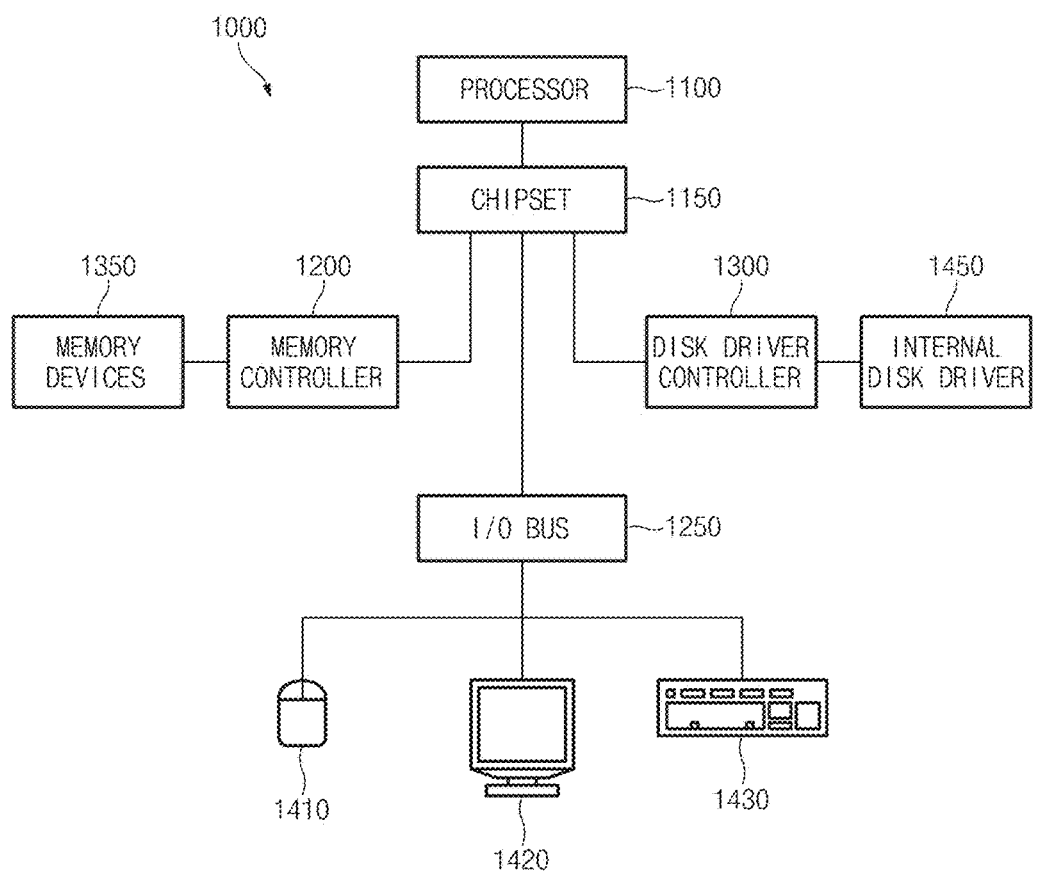
FIG. 6 illustrates a block diagram of an example of a representation of a system employing a DICE latch and or semiconductor device in accordance with the various embodiments discussed above with relation to FIGS. 2-5.

The DICE latch and or semiconductor device as discussed above (see FIGS. 2-5) are particular useful in the design of other memory devices, processors, and computer systems. For example, referring to FIG. 6, a block diagram of a system employing a DICE latch and or semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one DICE latch and or semiconductor device as discussed above with reference to FIGS. 2-5. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one DICE latch and or semiconductor device as discussed above with relation to FIGS. 2-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 6 is merely one example of a DICE latch and or semiconductor device as discussed above with relation to FIGS. 2-5. In alternate embodiments, such as, for example but not limited to, cellular phones or digital cameras, the components may differ from the embodiments illustrated in FIG. 6.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The above embodiments are not limited by the type of deposition, etching polishing, and patterning steps described herein. Nor are the embodiments limited to any specific type of semiconductor device. For example, the present disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
    a first dual interlocked storage cell (DICE) latch; and
    a second DICE latch located adjacent to the first DICE latch, and configured to share a specific region thereof with the first DICE latch,
    wherein each of the first DICE latch and the second DICE latch has at least 4 nodes storing at least 2 pairs of complementary values.

2. The semiconductor device according to claim 1, wherein:
    each of the first DICE latch and the second DICE latch is configured in a manner that transistors receiving data are formed in different active regions.

3. The semiconductor device according to claim 1, wherein the first DICE latch and the second DICE latch are configured to share an active region of any one of transistors receiving data.

4. The semiconductor device according to claim 3, wherein the first DICE latch and the second DICE latch are configured to share an active region of one of the outermost transistors from among the transistors receiving data.

5. The semiconductor device according to claim 4, wherein the first DICE latch and the second DICE latch are arranged symmetrical to each other on the basis of the shared active region.

6. The semiconductor device according to claim 1, wherein each of the first DICE latch and the second DICE latch includes:
    a latch circuit configured to store data through at least four even connection lines which are alternately inversion-driven; and
    a data input circuit configured to input data to the latch circuit based on an input control signal.

7. The semiconductor device according to claim 6, wherein the data input circuit includes:
    a first switching element configured to couple a first data input terminal receiving data of a first logic level to a first connection line based on the input control signal;
    a second switching element configured to couple a second data input terminal receiving data of a second logic level opposite to the first logic level to a second connection line based on the input control signal;
    a third switching element configured to couple the first data input terminal to a third connection line based on the input control signal; and
    a fourth switching element configured to couple the second data input terminal to a fourth connection line based on the input control signal.

8. The semiconductor device according to claim 7, wherein:
    in each of the first DICE latch and the second DICE latch, the first to fourth switching elements are formed in different active regions.

9. The semiconductor device according to claim 7, wherein the first switching element of the first DICE latch and the first switching element of the second DICE latch are configured to share an active region.

10. The semiconductor device according to claim 7, wherein the first to fourth switching elements of the first DICE latch are arranged symmetrical to the first to fourth switching elements of the second DICE latch on the basis of a shared active region.

11. The semiconductor device according to claim 6, further comprising:
    a reset circuit configured to couple connection lines having the same logic level from among the connection lines to a power-supply voltage terminal.

12. A dual interlocked storage cell (DICE) latch comprising:
    a DICE latch region including:
    latch circuits configured to receive data; and
    a data input circuit including a plurality of transistors configured to input the data to a corresponding latch circuit based on an input control signal,
    wherein an active region of one of the transistors from the plurality of transistors is formed to deviate from the DICE latch region to share with one of the transistors of a contiguous DICE latch,
    wherein the DICE latch region includes at least 4 nodes storing at least 2 pairs of complementary values.

13. The DICE latch according to claim 12, wherein the one of the transistors formed to deviate from the DICE latch region is an outermost transistor from among the plurality of transistors.

14. The DICE latch according to claim 12, wherein the active regions of the plurality of transistors are separated from each other.

* * * * *